United States Patent
Sotiriou et al.

(10) Patent No.: US 7,934,186 B2
(45) Date of Patent: Apr. 26, 2011

(54) APPARATUS AND METHOD FOR OPTIMIZING DELAY ELEMENT IN ASYNCHRONOUS DIGITAL CIRCUITS

(75) Inventors: Christos P. Sotiriou, Crete (GR); Spyridon Lymperis, Crete (GR)

(73) Assignee: Institute of Computer Science (ICS) of the Foundation for Research & Technology Hellas—Foundation for Research and Technology Hellas (Forth), Heraklion, Crete (GR)

( * ) Notice: Subject to any disclaimer, the term of this patent is extended or adjusted under 35 U.S.C. 154(b) by 455 days.

(21) Appl. No.: 11/933,230

(22) Filed: Oct. 31, 2007

(65) Prior Publication Data

US 2009/0108900 A1    Apr. 30, 2009

(51) Int. Cl.
*G06F 17/50*    (2006.01)
(52) U.S. Cl. ......... 716/108; 716/113; 716/114; 716/134
(58) Field of Classification Search .................. 716/108, 716/113–114, 134
See application file for complete search history.

(56) References Cited

U.S. PATENT DOCUMENTS

| | | | |
|---|---|---|---|
| 6,553,550 | B1 | 4/2003 | Menegay et al. |
| 2002/0175705 | A1 | 11/2002 | Lowy et al. |
| 2003/0177455 | A1* | 9/2003 | Kaufman et al. .................. 716/2 |
| 2004/0210857 | A1* | 10/2004 | Srinivasan ......................... 716/2 |
| 2005/0046458 | A1 | 3/2005 | Schroeder et al. |
| 2005/0216247 | A1 | 9/2005 | Ikeda et al. |
| 2006/0288320 | A1* | 12/2006 | Murgai et al. ..................... 716/6 |

OTHER PUBLICATIONS

PCT US08/78319 ISR, Sep. 30, 2008, Nanochromous Logic.

* cited by examiner

*Primary Examiner* — Paul Dinh
(74) *Attorney, Agent, or Firm* — Cooley LLP (57) ABSTRACT

A computer readable storage medium includes executable instructions to construct a delay element to replicate the timing of critical gates and paths within a segment of an asynchronous circuit. The rise and fall delay mismatch of the delay element is minimized without obeying timing constraints. The position of each output of the delay element is determined to include a globally shared node within the segment and a non-shared local node in the segment.

9 Claims, 8 Drawing Sheets

---

Construct Delay Element to Match Timing Variation of Critical Gates and Paths; Minimize Rise/Fall Delay Mismatch without Obeying Timing Constraints — 200

Determine Position of Each Output of Shared Delay Element; Timing Optimization — 202

Critical Path Analysis for output F

1. a, n1(AND2), n1, n2 (NOR3), n2, n3 (INV), n3, n4 (AND3), n4, n5 (NOR3), n5, F (INV)
2. f, a1(AND2), n1, n2 (NOR3), n2, n3 (INV), n3, n4 (AND3), n4, n5 (NOR3), n5, F (INV)
3. b, n2(NOR3), n2, n3 (INV), n3, n4 (AND3), n4, n5 (NOR3), n5, F (INV)
4. c, n2 (NOR3), n2, n3 (INV), n3, n4 (AND3), n4, n5 (NOR3), n5, F (INV)
5. d, n6 (OR2) n6, n1 (AND3), n4, n5 (NOR3), n5, F (INV)
6. e, n6 (OR2), n6, n4 (AND3), n4, n5 (NOR3), n5, F(INV)

Total number for 6 critical paths = 30 gates

Critical Gate Characterization
Combinational Logic Clouds x% most critical Gates NOR3  10/30 = 33%
AND3  6/30 = 20%
AND2  2/30 = 6%
OR2   2/30 = 6%
INV   10/30 = 33%

APPARATUS AND METHOD FOR OPTIMIZING DELAY ELEMENT IN ASYNCHRONOUS DIGITAL CIRCUITS

BRIEF DESCRIPTION OF THE INVENTION

The present invention relates to digital circuits. More particularly, the invention relates to techniques for optimizing the delay precision and area of digital circuit delay elements.

BACKGROUND OF THE INVENTION

De-synchronization is a process by which a synchronous circuit with one or more clock signals is transformed into a circuit where all clock signals are generated locally by a combination of asynchronous latch controllers, i.e. clock-less control circuits. The clock-less control circuits generate local clock signals and include delay elements or delay references, which model the circuit delay and timing depth of a combinational logic cloud. The delay elements also operate to regulate the local period of the clock-less control circuits.

A de-synchronized circuit, compared to its synchronous counterpart, presents several advantages, namely (i) post-silicon timing adaptivity to process, voltage and temperature variation, (ii) post-silicon voltage-controlled frequency tuning, (iii) lower electromagnetic emissions through appropriate skewing of the local de-synchronized clocks, (iv) non globally worst-case performance, as in the case of a synchronous circuit, as any timing margins from the typical process corner can be localized to particular circuit regions and integrated to their particular delay elements, thus avoiding global guard-banding.

A de-synchronized circuit typically requires the use of master and slave latches, instead of flip-flops, for sequential memory elements; this is due to the fact that there is skew present in the locally generated clocks. Any circuit with flip-flops requires zero, or very little timing skew between the clock signals driving the flip-flops. A de-synchronized circuit uses master and slave latches. A de-synchronized circuit generates two individual and independent master and slave clock signals, which operate as a replacement to the edge-triggered flip-flop clock. In this way, any skew between the local clocks can be arbitrary and correct flow of data can be imposed through the use of a data communication and synchronization mechanism, such as a handshake.

A de-synchronized circuit is composed of a number of de-synchronization regions, also referred to as de-synchronization partitions or de-synchronization register groups, whereby each such region (i) is driven by and controlled by a single asynchronous controller, which generates a common clock for all of the regions' sequential elements, and (ii) contains a single delay element per point-to-point connection with other regions. Observe that the de-synchronized circuit is asynchronous. Both terms are used interchangeably herein. Each delay element introduces an appropriate time delay, modeling the time delay of the combinational logic cloud present between each such point-to-point connection pair. The asynchronous controllers of the de-synchronization regions communicate with each other using an asynchronous handshake protocol, whereby each point-to-point connection assumes a request/acknowledgment signal pair. In the case of a many to one connection between de-synchronization regions, e.g. n-to-1, an n-input synchronization element, known as a C element or C gate must be used to generate a single request signal from the n available in order for the controller to wait for the last request signal to arrive. In the opposite case of a one to many connection between regions, e.g. 1-to-n, a C element must used to generate a single acknowledgment signal from the n available in order for the controller to wait for the last acknowledgment to arrive. Typically, the handshake protocol used is 2-phase in order to save on transitions on the handshake wires.

The transformation process of a synchronous circuit to a de-synchronized circuit does not offer a unique solution, but multiple, depending on the selection of de-synchronization regions and their number. However, no matter what the de-synchronized circuit, the flow of data through it will always be identical to the original data in the synchronous circuit, a property known as flow-equivalence.

Typically, the steps required to transform a synchronous circuit to a de-synchronized equivalent are the following:

(i) Manual specification of or automated derivation of the de-synchronization regions. This is a list of the sequential elements which belong to each de-synchronization region.

(ii) Conversion of the sequential elements of all de-synchronization regions into master and slave equivalents. Every flip-flop in every de-synchronization region is converted to a pair of master and slave latches with the same functionality and input and output signals. Typically, the master latch implements the equivalent flip-flop functionality, whereas the slave latch is an ordinary transparent latch with a single gate signal.

(iii) Insertion of asynchronous controllers generating the local clocks and delay-elements based on the data connectivity between regions. Each connection between regions requires a handshake pair, a single delay element, based on the timing depth of the combinational logic present between the regions, and potentially a synchronization element, at the sender and receiver for multiple input and output connections (e.g., the previously described C elements). Each controller outputs a local clock signal, which feeds all the sequential elements within its region. If the number of elements is large, it is necessary to buffer this signal using a low-skew buffer tree in a manner similar to a clock tree.

There are three significant drawbacks with conventional de-synchronization schemes: (i) the large number of delay elements required for m to n connections, which significantly impacts the area of the de-synchronized circuit, (ii) the timing mismatch between a delay element and its corresponding combinational logic cloud, and (iii) the rise/fall symmetry requirement stemming from 2-phase controller operation, transition time and buffering constraints for the delay elements.

Therefore, it would be desirable to provide techniques to address these drawbacks associated with conventional de-synchronization schemes.

SUMMARY OF THE INVENTION

An embodiment of the invention includes a computer readable storage medium with executable instructions to construct a delay element to replicate the timing of critical gates and paths within a segment of an asynchronous circuit. The rise and fall delay mismatch of the delay element is minimized without obeying timing constraints. The position of each output of the delay element is determined to include a globally shared node within the segment and a non-shared local node in the segment.

An embodiment of the invention includes an asynchronous circuit with a global delay element shared within a segment of the asynchronous circuit. At least one non-shared delay element local to a portion of the segment of the asynchronous circuit is positioned downstream of the global delay element.

BRIEF DESCRIPTION OF THE FIGURES

The invention is more fully appreciated in connection with the following, detailed description, taken in conjunction with the accompanying drawings, in which.

DETAILED DESCRIPTION OF THE INVENTION

Figure 1:
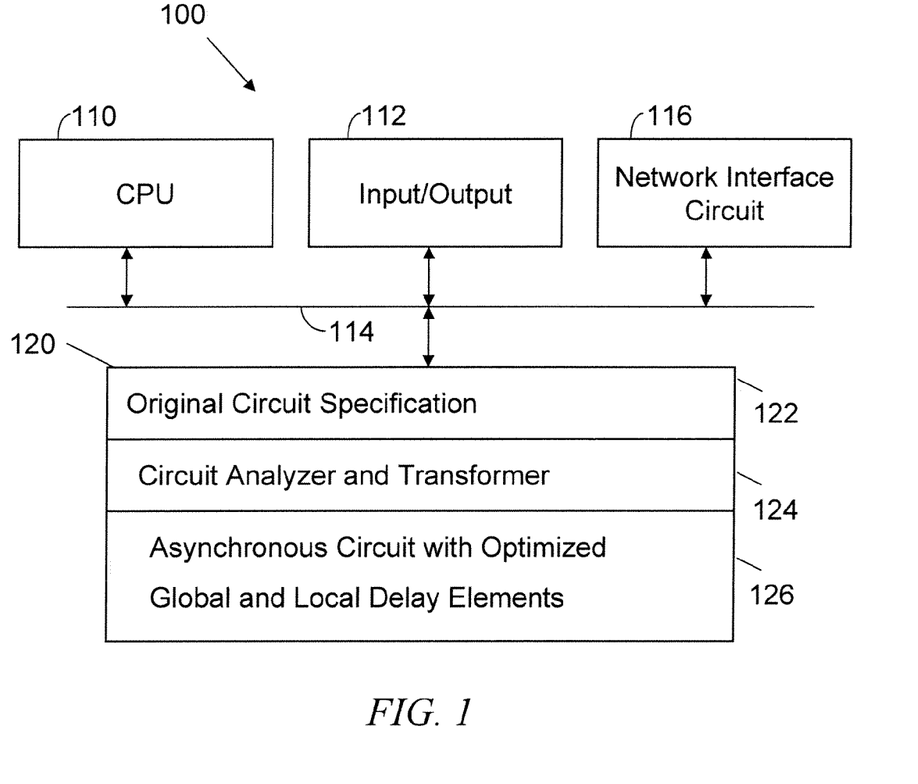
FIG. 1 illustrates a computer configured in accordance with an embodiment of the invention.

FIG. 1 illustrates a computer 100 configured in accordance with an embodiment of the invention. The computer 100 includes standard components, such as a central processing unit 110 and input/output devices 112 connected via a bus 114. The input/output devices 112 may include a keyboard, mouse, display, printer, and the like. A network interface circuit 116 is also connected to the bus 114. The network interface circuit 116 provides connectivity to a network (not shown). Thus, the computer 100 may operate in a stand-alone mode or in a client-server configuration.

A memory 120 is also connected to the bus 114. The memory 120 stores data and executable instructions to implement operations of the invention. For example, the memory 120 stores an original circuit specification, such as a Boolean design or a netlist. The original circuit specification is processed by the circuit analyzer and transformer module 124, which implements operations of the invention. The output of the circuit analyzer and transformer module 124 is a specification for an asynchronous circuit with optimized global and local delay elements 126. The specification may then be used to fabricate the circuit using standard techniques.

Figure 2:
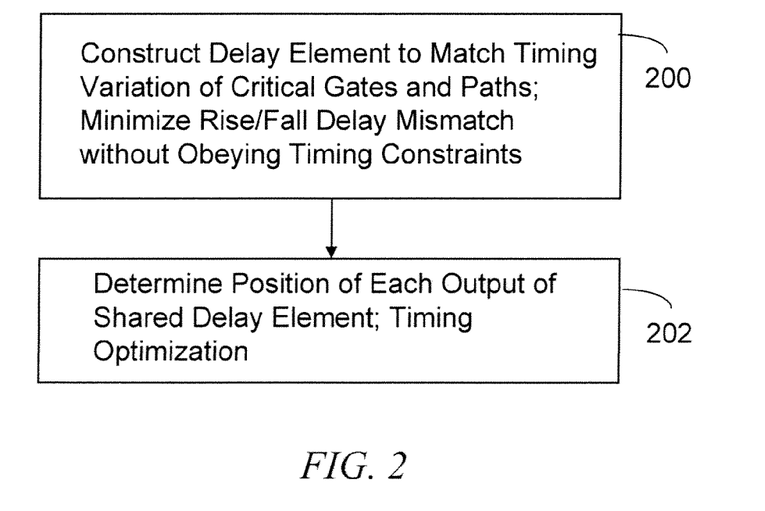
FIG. 2 illustrates processing operations associated with an embodiment of the invention.

FIG. 2 illustrates processing operations associated with an embodiment of the circuit analyzer and transformer 124. In one embodiment of the invention, the circuit analyzer and transformer 124 operates in two phases. In the first phase (Phase I) a delay element is constructed to match or replicate the timing variation of critical gates and paths 200. This operation may be implemented by minimizing rise and fall mismatch without obeying timing constraints. In the second phase, the position of each output of a shared delay element is determined and timing is optimized 202.

Figure 3:
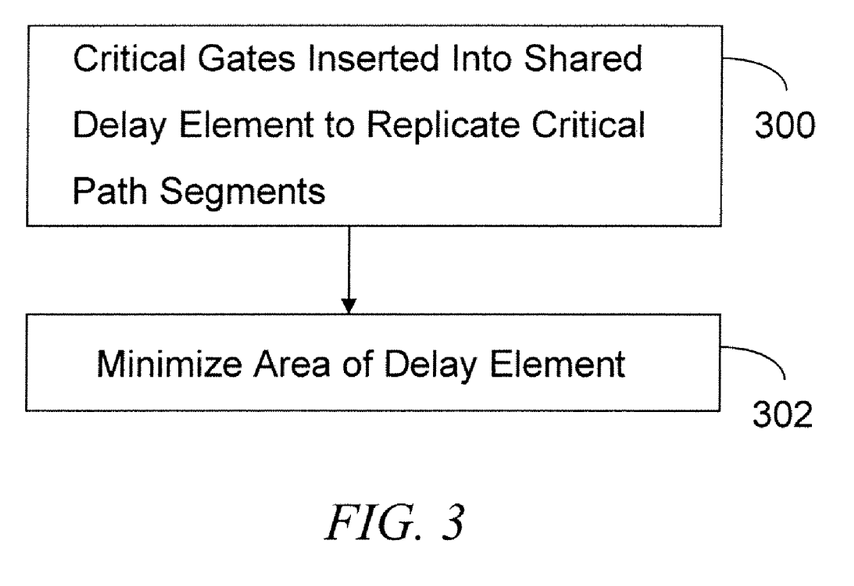
FIG. 3 illustrates delay element matching operations performed in accordance with an embodiment of the invention.

The first phase (i.e., 200) may be implemented with the operations illustrated in FIG. 3. Critical gates are inserted into a shared delay element to replicate critical path segments 300. The area of the delay element is then minimized 302. The second phase (i.e., 202) may be implemented with the operations illustrated in FIG. 4. Delay elements are initially grouped into classes 400. The classes are then timing optimized with a global cost function 402.

Figure 5:
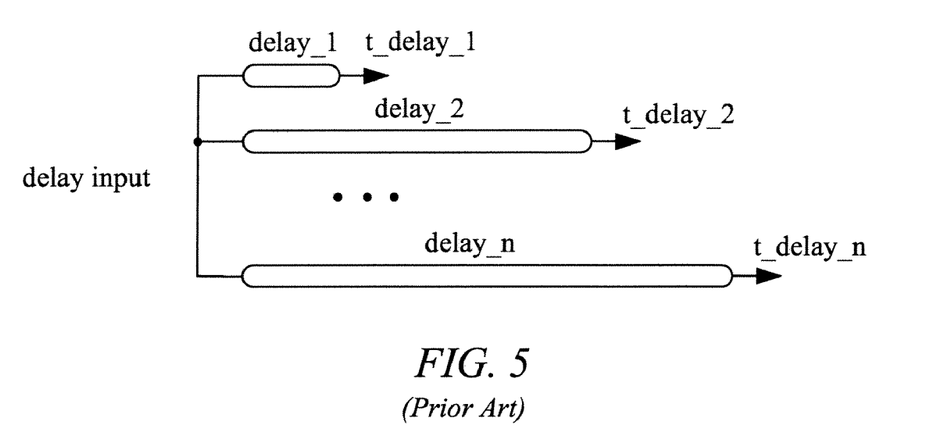
FIG. 5 illustrates prior art unshared delay elements.
Figure 6:
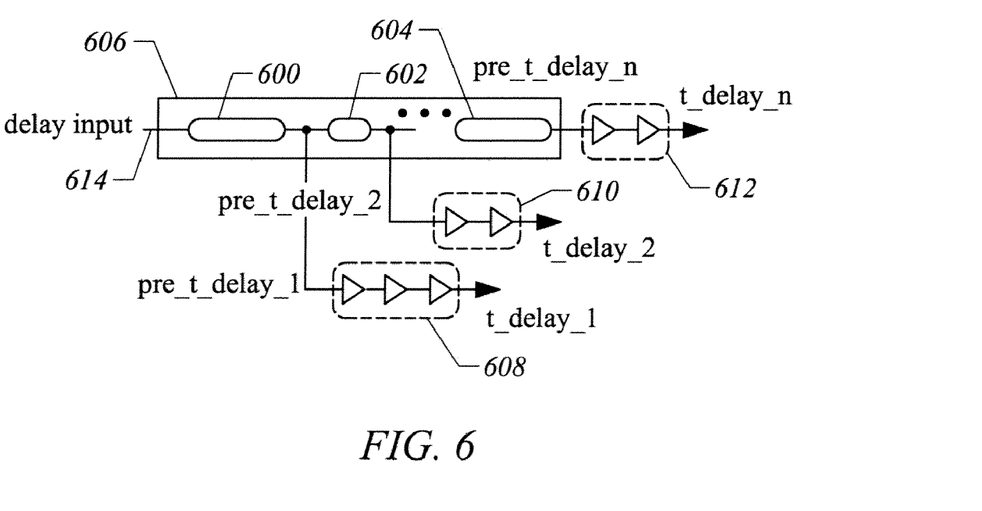
FIG. 6 illustrates global shared delay elements and local non-shared delay elements utilized in accordance with an embodiment of the invention.
Figure 7:
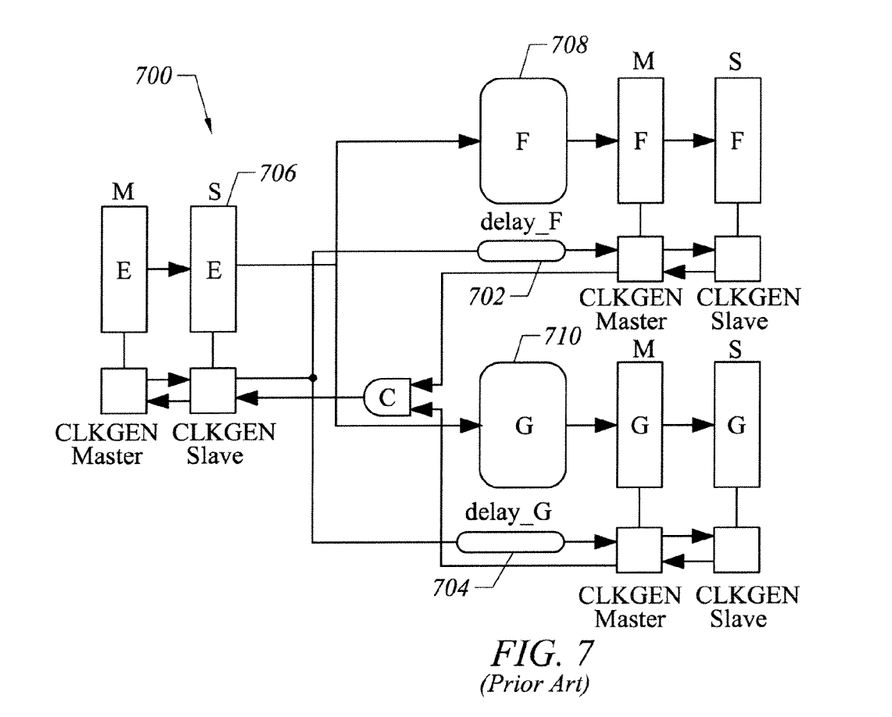
FIG. 7 illustrates a prior art asynchronous circuit with two physically separate delay elements.
Figure 8:
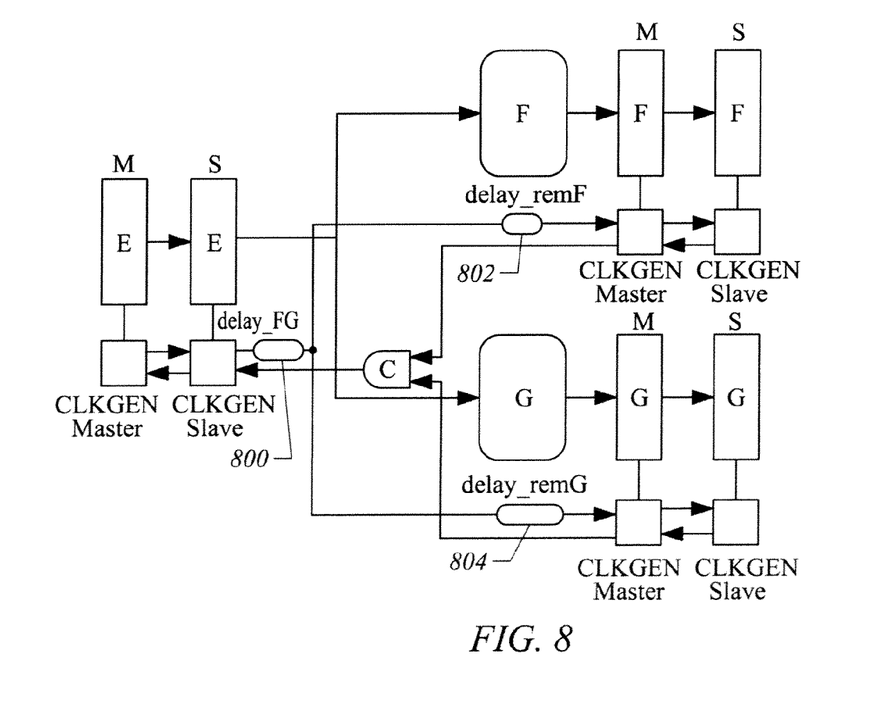
FIG. 8 illustrates an asynchronous circuit with a lower gate area shared delay element and a remainder delay element in accordance with an embodiment of the invention.
Figure 9:
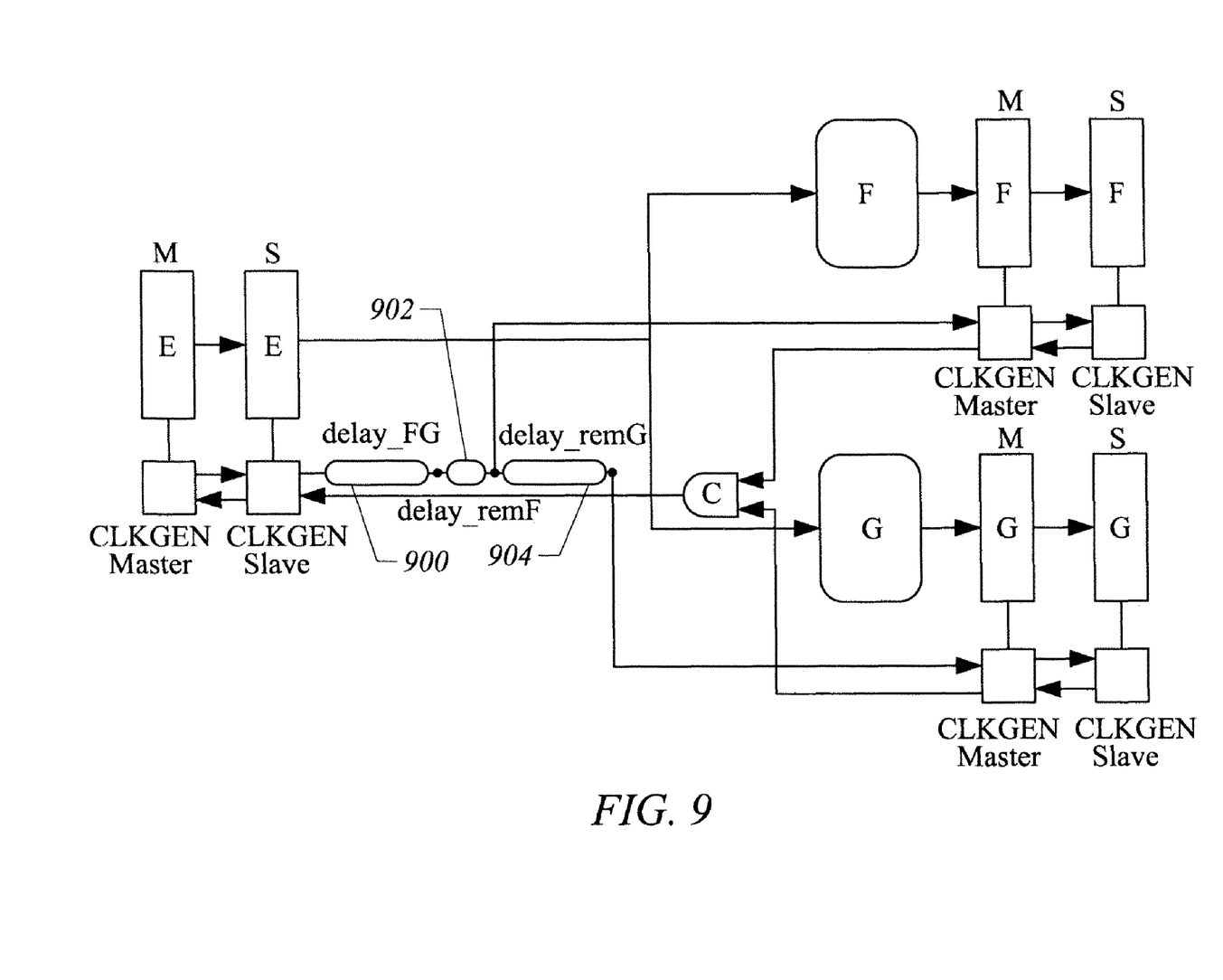
FIG. 9 illustrates an asynchronous circuit with a lower gate area shared tapped delay element and chained delay elements utilized in accordance with an embodiment of the invention.

These operations are more fully appreciated with the following discussion. Initially, the prior art delay element approach is discussed in connection with FIG. 5. This is contrasted with the shared global and un-shared local delay elements of the invention as shown in FIG. 6. FIG. 7 illustrates the prior art delay element approach for a given circuit, whereas FIGS. 8 and 9 illustrate various embodiments of the shared global and un-shared local delay elements of the invention in the same circuit. FIGS. 10-15 illustrate a circuit processed in accordance with an embodiment of the invention.

In the current state of the art, the de-synchronization of a circuit requires the use of multiple delay elements, one per point-to-point connection. FIG. 5 illustrates such a circuit. A delay line is provided for each point-to-point connection. In particular, n delay lines are illustrated for n point-to-point connections. Thus, for a circuit with m to n connections between de-synchronization regions, i.e. m regions connect to n regions, m times n delay elements are required.

The invention utilizes a shared delay element that is capable of replacing the conventional, n, separate delay elements. The use of the shared symmetrical delay element does not cause any other modification to a local, adaptive clocking methodology, such as de-synchronization.

FIG. 6 illustrates shared global delay elements and local, non-shared delay elements in accordance with the invention. Delay elements 600, 602, and 604 form a global, shared delay element 606. Delay elements 608, 610 and 612 are local, non-shared delay elements.

The shared delay element has a single input point 614, but n output points, which provide the n required input to output delays. Thus, each output point shares a segment of gates with points of lesser time delay. This factor provides significant area savings compared to the conventional method of using multiple, discrete, delay elements. The area gain of using the shared delay elements is proportional to the number of 1 to n delay element connections required by the circuit specification. Thus, the total area savings are proportional to m times n.

Precise timing calibration for all output points of a shared delay element is required by any timing sensitive circuit. The precise timing calibration of the n output delays is implemented with the circuit analyzer and transformer 124, which is configured to fine-tune the type, number and size of the circuit gates that constitute the shared delay element. The circuit analyzer and transformer 124 produces an optimal gate configuration for specified timing constraints. The area of the delay element may be simultaneously optimized by the circuit analyzer and transformer 124.

The advantages of the current invention address the drawbacks of the current state of the art. Specifically, the circuit analyzer and transformer 124 constructs 1 to n delay elements with the following useful properties for effective de-synchronization of synchronous circuits: (i) lower area occupancy due to the use of shared common delay element segments, (ii) timing variation of the delay element delay similar to that of the circuit's critical gates and critical paths, (iii) optimized timing for all of the delay elements' endpoints, including both timing delay optimization, i.e. minimum timing error with respect to the endpoint required time delay, and transition time optimization, i.e. the transition time (rise and fall) of every net within the delay element is fixed to obey a maximum constraint value, and (iv) symmetrical delay for the rising and falling modes of operation of the delay element.

As previously discussed, the circuit analyzer and transformer 124 operates in two discrete phases, Phase I (200) and Phase II (202). In one embodiment, the inputs of both phases are: (i) the gates of the circuit's critical paths, along with statistics for their occurrence, (ii) a list of required arrival times for the n outputs of the shared delay element, (iii) values for the output loads of each of the n outputs, (iv) the specification of the transition time for the input of the delay element, (v) a maximum transition time constraint for each net of the delay element, and (vi) a maximum rise/fall mismatch constraint.

Phase I (200) focuses on constructing a delay element solely for matching, as much as possible, the timing variation of the critical gates and paths, while minimizing the rise/fall delay mismatch without obeying any of the timing constraints or optimizing with respect to them. During Phase I, the gates of the critical paths, along with their statistical number are used to construct the shared delay element. The constituent gates of the delay elements for each segment leading to an output tap uses gates of both similar function and size to those of the actual critical paths of that output. The variation similarity is maximized.

Phase I optimizes rise/fall mismatch and delay element area by operating in two discrete operations, as shown in FIG. 3. During operation 300, the critical gates are inserted into the shared delay element in such an order as to replicate, as much as possible, their corresponding critical path segments. Each critical gate that is to be inserted in the delay element is inserted with opposite rise/fall polarity relative to its previous instance so as to minimize the rise/fall timing delay mismatch. The newly inserted instance may not be necessarily added after the previous instance; its position depends on the critical path it mimics. In the case where the prior instance gate is of positive polarity, an inverter must be added to the inputs of the new instance so that the total number of rise/fall transitions remains constant in order to fulfill the goal of minimizing rise/fall delay mismatch. The overall polarity of the shared delay element may be inverting or non-inverting. Ultimately, the polarity of outputs is fixed during Phase II. At the end of operation 300, a symmetrical delay element with no output taps and a single input is created. Its delay may be larger or smaller than required, as its delay is not taken into account.

The aim of operation 302 is to minimize the area of the delay element by resizing its constituent gates and without altering their type. Operation 302 is necessary since the size of the gates in the critical paths may be significantly larger or smaller for fan-out driving reasons than those required within the delay element at a particular node. The ratio of gate area over gate delay, i.e. (Area_gate/Delay_gate), is defined as an optimization cost function. A single loop of the optimization process operates as follows: each gate of the delay element is traversed starting from the delay element input. During that traversal, each visited gate along with any of its auxiliary inverters is resized, if possible, to minimize its local (Area_gate/Delay_gate) factor. The Delay_gate value is computed by performing incremental static timing analysis in the local region of the inspected gate and using the stored timing data. In this way, the minimum area gate with the maximum local delay impact is selected. The local, incremental static timing analysis re-computes the delay of the gate in question by taking into account the differences in the delays of (i) its immediate predecessor gate and (ii) its two successor gates in this local segment of the delay element. The local transition time implied by the resizing is also computed as part of the local static timing analysis. If the local transition time exceeds the user-defined maximum transition constraint for a given resizing it is rejected. The degree of resizing is controlled heuristically through the introduction of a maximum resize factor, which represents the maximum allowable area ratio change during a single optimization run. A maximum resize factor of value 0 implies that no resizing is allowed, a maximum resize factor of value 1 implies that a resizing up to 100% of area increase is allowed, and a value of −1 implies that any resizing is allowed. This processing is repeated repeatedly until either no gate is modified or a predetermined number of maximum optimization iterations is reached.

Phase II (202) operates on the output of Phase I (200), i.e. a minimum (Area/Delay) shared delay element, which does not necessarily obey a maximum transition time constraint at each of its nodes. Phase II selects the position of each output for each timing delay required along the length of the shared delay element. Phase II determines the position of each output of the shared delay element based on its required timing delay and timing optimization that minimizes the timing error of all outputs, while introducing any required local buffering for driving the output loads and fixing transition times, which may be violated by the introduction of an output fanning out from an internal net of the shared delay element.

Figure 4:
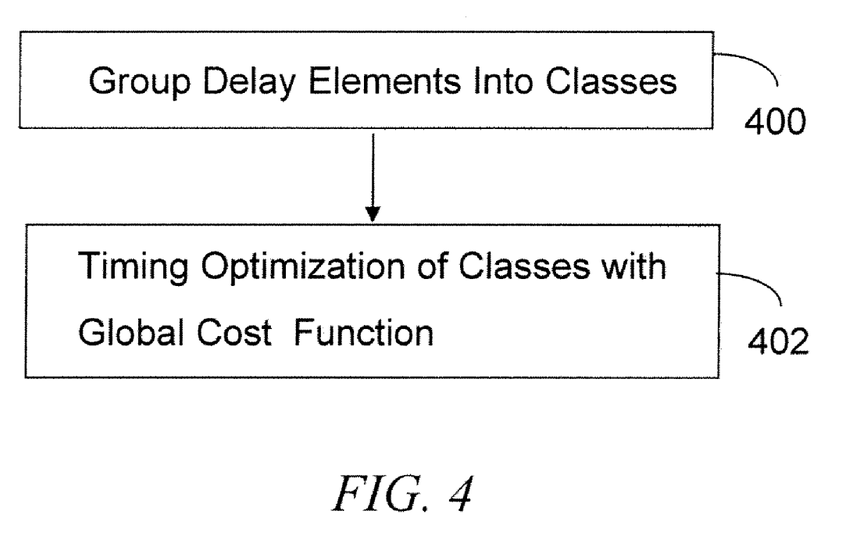
FIG. 4 illustrates delay element positioning operations performed in accordance with an embodiment of the invention.

To simplify the assignment of outputs to delay element locations, Phase II processing groups the delay outputs into a set of unique output classes 400. Output classes are sets of outputs that have a relatively small delay difference. The formation of classes works by performing static timing analysis to the shared delay element of Phase I and by observing the smallest observed timing delay difference, d_min, between any pair of gates within the shared delay element gate chain. The parameter d_min serves as a minimum resolution factor for dividing outputs into output classes. Thus, any two or more outputs with the required time delay difference smaller than the d_min parameter are joined into the same output group. From that point onward, the Phase II process operates on the grouped outputs and the assignment of outputs to groups is never modified. However, it is possible at the end of Phase II to fine-tune the delay of each output within a group by forking gate chains from the common group output, which will fine-tune the delay, correct the polarity and fix any transition time constraint of each output.

Phase II optimizes the position of output groups, the degree of timing errors and transition time fixing. This is done by taking into account global perturbation for a given optimization operation. This is necessary since any local change during Phase II is manifested as a global change. The complexity of Phase II is that of a non-linear optimization problem and therefore requires a heuristic algorithmic approach, as disclosed herein.

In one embodiment, Phase II operates in a hill-climbing, heuristic loop, which performs tentative moves of grouped outputs along with their required local buffering and local timing optimization. The impact to a global cost function at each move is evaluated. The local timing optimization consists of adding a chain of gates, potentially of increasing size, for buffering. The chain of gates fine-tunes any delay mismatch. This local buffering chain is referred to as a fine-grain calibration buffer. The global cost function is defined as the sum of the local timing errors of each shared delay element output, i.e. SUM (ERROR (t_output_x)), where the local timing error of an output is itself defined as the difference between the expected arrival time of that output with the global delay input as starting point and reference and the actual arrival time of that output measured using static timing analysis, i.e. (t_output_x−t_constraint_output_x). A timing error margin may be introduced as a guard band for post silicon fabrication process mismatches, thus modifying the local timing error equation as (t_output_x−(t_constraint_output_x+t_error_margin)).

During each iteration of the optimization loop, each output is inspected to determine its locally optimal position. The optimal position is at a location where a move either maximally reduces cost or minimally increases cost. The candidate move for each output is a move of that output by a single gate either forward or backwards. The global cost impact of such a move is reported. The output is locked and all others are inspected in turn in the same manner until all grouped outputs have been handled. At the end of an iteration, the sequence of forward and backward tentative moves that yielded an overall globally optimal cost is actually performed. This optimization loop is repeatedly called until the global cost function is decreasing. After loop iteration is complete, full static timing analysis of the complete shared delay element is performed to minimize local timing errors.

FIG. 7 illustrates a circuit 700 configured with two physically separate delay elements 702 (delay_F) and 704 (delay_G). This is a prior art configuration with multiple delay elements, one per point-to-point connection. Delay element 702 replicates the delay from element 706 (E) to element 708 (F). Delay element 704 replicates the delay from element 706 (E) to element 710 (G).

FIG. 8 illustrates an alternate use of delay elements for the same circuit. In particular, a shared delay element 800 (delay_FG) constitutes a global, shared delay element. Downstream local, unshared delay elements 802 (delay_remF) and 804 (delay_remG) are also utilized.

FIG. 9 illustrates another use of delay elements for the same circuit. The circuit includes shared, global delay element 900 (delay_FG). Local, unshared delay element 902 (delay_remF) and local, unshared delay element 904 (delay_remG) are also utilized.

Figure 10:
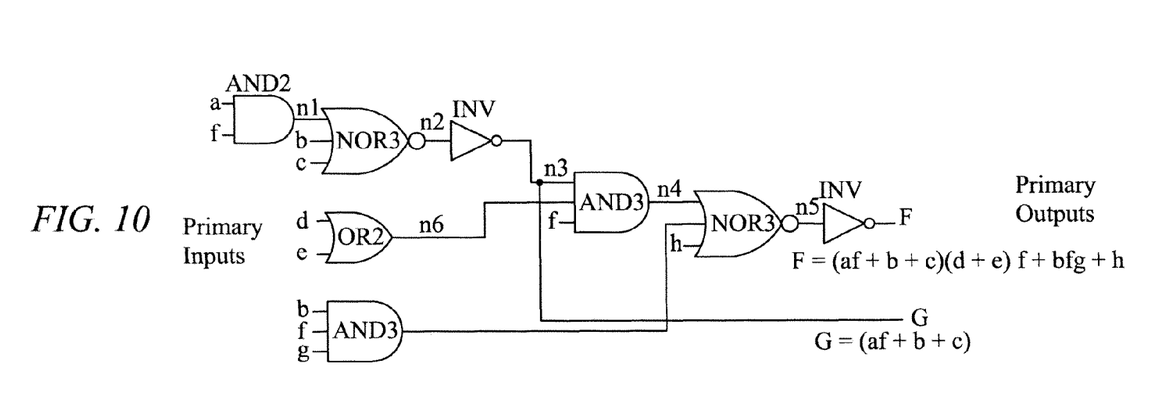
FIG. 10 illustrates a circuit processed in accordance with an embodiment of the invention.

FIG. 10 illustrates a circuit processed in accordance with an embodiment of the invention. The circuit includes two outputs, F and G. Each output has a corresponding critical path. The techniques of the invention are used to construct a delay element with a mix of gates similar to those in the critical paths. The resultant shared delay element tracks delay variations. The process of critical path replication is performed during Phase I processing. Timing is optimized during Phase II processing.

Figure 11:
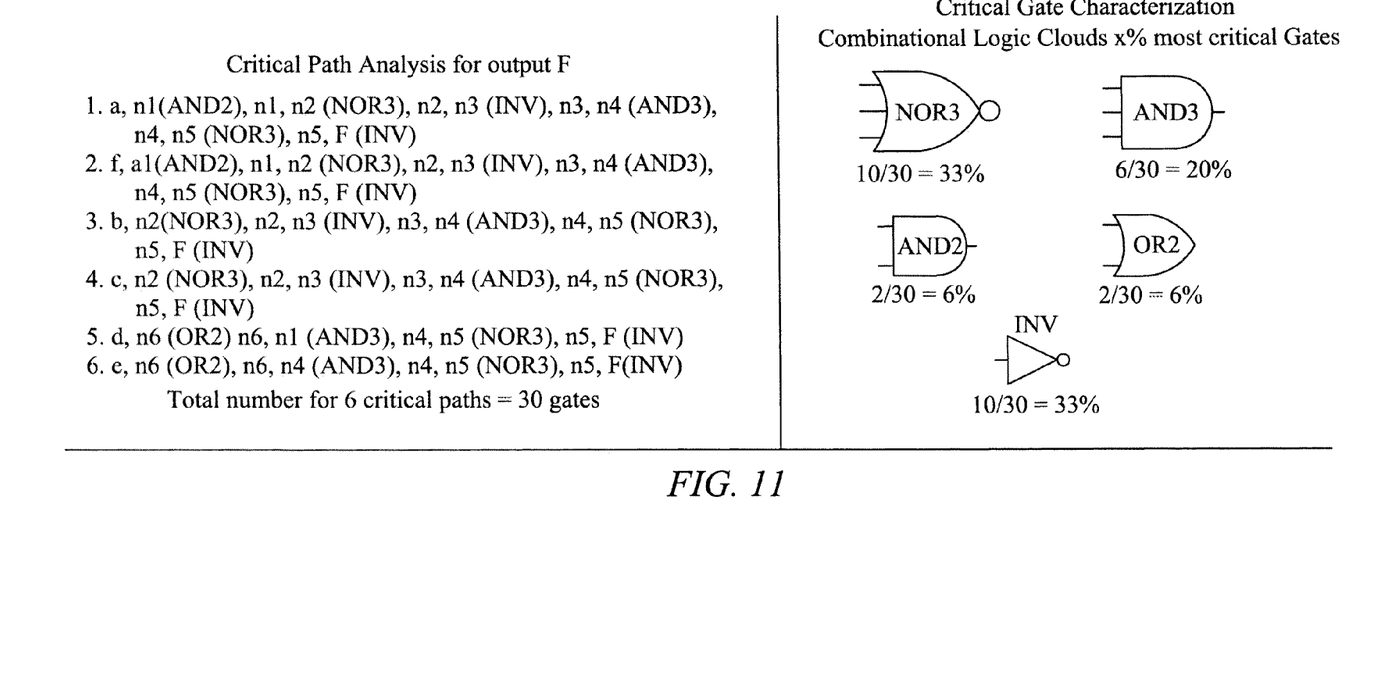
FIG. 11 illustrates the results of a critical path analysis that derives the percentage of occupancy of the delay element that each gate in the critical path should assume.
Figure 12:
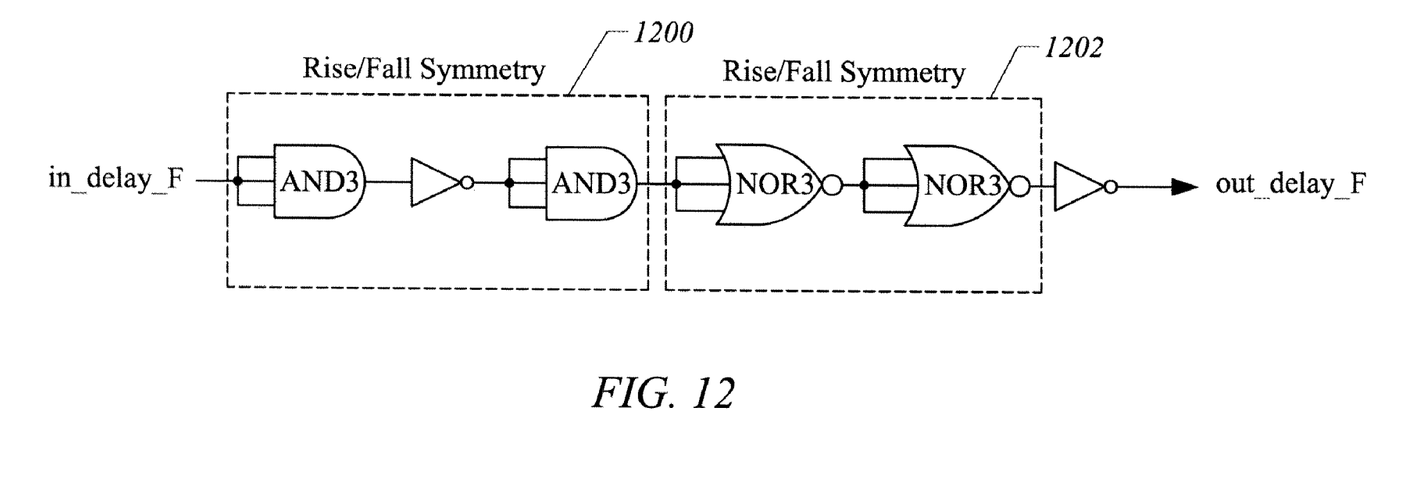
FIG. 12 illustrates global delay elements to replicate critical path F of FIG. 10.
Figure 13:
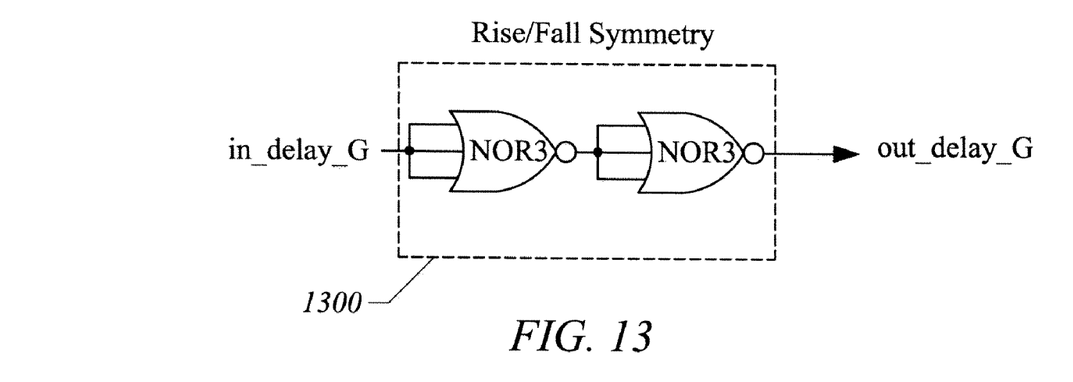
FIG. 13 illustrates global delay elements to replicate critical path G of FIG. 10.

FIG. 11 illustrates a critical path analysis and how the resultant values are used to derive the percentage of occupancy of the delay element that each gate in the critical path should assume. FIG. 12 illustrates circuit elements that may be used to replicate the delay for the critical path to output F. In particular, the figure illustrates block 1200 and 1202. FIG. 13 illustrates circuit elements 1300 that may be used to replicate the delay for the critical path to output G. Observe that block 1202 of FIG. 12 is the same as block 1300 of FIG. 13.

Figure 14:
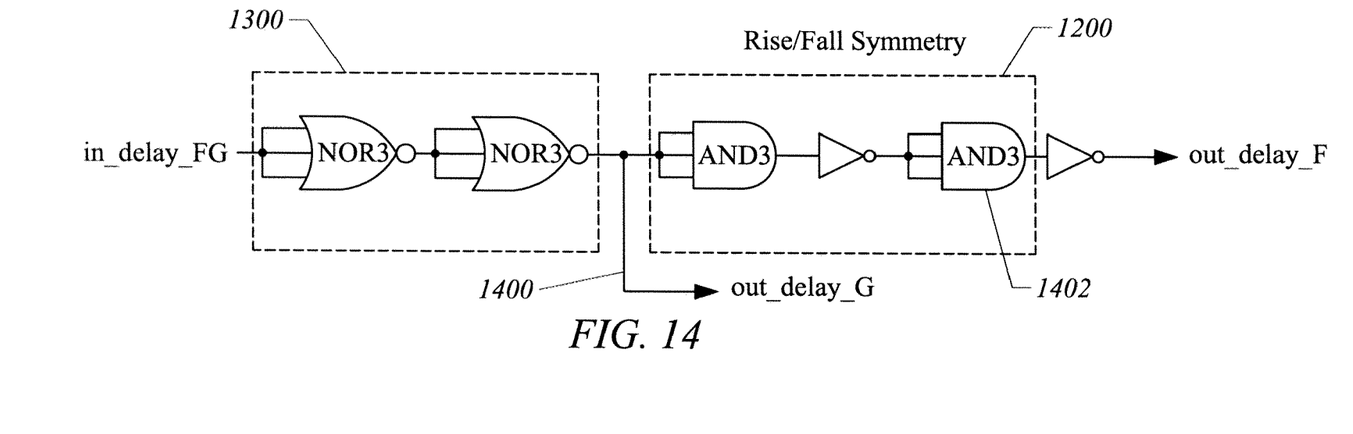
FIG. 14 illustrates merged and shared delay elements in accordance with an embodiment of the invention.

This block may be used as a shared, global delay element. In particular, as shown in FIG. 14, block 1300 is placed in front of block 1200 and a tap 1400 is used to supply the delayed signal for critical path G (i.e., out_delay_G). The output for the critical path F remains the same since the input signal traverses the same path, only in a different order. That is, in FIG. 12 the signal path is through blocks 1200 and 1202, while in FIG. 13 the signal path is through blocks 1300 (same as 1202) and 1200.

Figure 15:
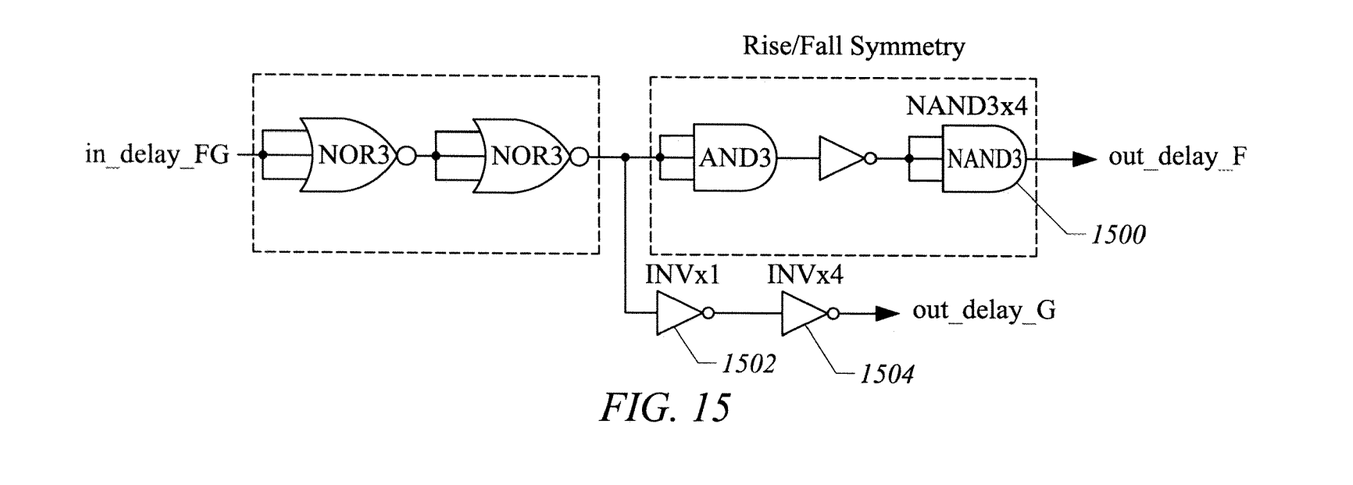
FIG. 15 illustrates timing and area optimized merged and shared delay elements with local, fine grain calibration buffers in accordance with an embodiment of the invention.

FIG. 15 illustrates the circuit with optimized timing. In particular, the AND3 gate 1400 is replaced with a NAND3 gate 1550. Two inverters 1502 and 1504 are added for fine grain timing control.

An embodiment of the present invention relates to a computer storage product with a computer-readable medium having computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs, DVDs and holographic devices; magneto-optical media; and hardware devices that are specially configured to store and execute program code, such as application-specific integrated circuits ("ASICs"), programmable logic devices ("PLDs") and ROM and RAM devices. Examples of computer code include machine code, such as produced by a compiler, and files containing higher-level code that are executed by a computer using an interpreter. For example, an embodiment of the invention may be implemented using Java, C++, or other object-oriented programming language and development tools. Another embodiment of the invention may be implemented in hardwired circuitry in place of, or in combination with, machine-executable software instructions.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. A non-transitory computer readable storage medium, comprising executable instructions executed by a computer to cause the computer to:
   construct a shared delay element to replicate signal delay timing of gates forming a path within a segment of an asynchronous circuit, wherein signal rise and fall delay mismatch of the shared delay element is minimized using an inserted gate with opposite rise/fall polarity relative to a previous inserted gate; and
   Define shared delay element output nodes to include a globally shared node within the segment and a non-shared local node in the segment;

wherein the executable instructions to construct include executable instructions to process the following information: (i) critical paths of the gates of the asynchronous circuit, along with statistics characterizing the critical paths, (ii) a list of required arrival times for outputs of the shared delay element, (iii) values for output loads of each of the outputs, (iv) a specification of a transition time for an input of the shared delay element, (v) a maximum transition time constraint for each net of the shared delay element, and (vi) a maximum rise/fall mismatch constraint.

2. The non-transitory computer readable storage medium of claim 1 wherein the executable instructions to construct include executable instructions to:

insert critical gates into a shared delay element to replicate a path segment; and minimize area of the delay element.

3. The non-transitory computer readable storage medium of claim 2 wherein the executable instructions to minimize include executable instructions to resize delay element constituent gates without altering the type of delay element constituent gates.

4. The non-transitory computer readable storage medium of claim 3 wherein the executable instructions to minimize include executable instructions to utilize a static timing analysis to select a minimum area gate with the maximum local delay impact.

5. The non-transitory computer readable storage medium of claim 3 wherein the executable instructions to minimize include executable instructions to process a maximum resize factor specifying a maximum allowable area ratio change during a single optimization cycle.

6. The non-transitory computer readable storage medium of claim 1 wherein the executable instructions to determine include executable instructions to:

group delay elements into classes; and optimize classes with a global cost function.

7. The non-transitory computer readable storage medium of claim 6 wherein the executable instructions to group include executable instructions to group delay elements into classes with common timing attributes.

8. The non-transitory computer readable storage medium of claim 6 wherein the executable instructions to optimize include executable instructions to iterate in a loop until the global cost function is decreasing.

9. The non-transitory computer readable storage medium of claim 6 wherein the executable instructions to optimize include executable instructions to specify the global cost function as the sum of local timing errors of each shared delay element output.

* * * * *